United States Patent

Chen et al.

[11] Patent Number: 6,125,056
[45] Date of Patent: Sep. 26, 2000

[54] FAST PROGRAM MODE FOR NON-VOLATILE MEMORY

[75] Inventors: Johnny Chen, Cupertino; Tiao-Hua Kuo, San Jose; Nancy Leong, Sunnyvale, all of Calif.

[73] Assignee: Advanced Micro Devices, Inc., Sunnyvale, Calif.

[21] Appl. No.: 09/291,865

[22] Filed: Apr. 14, 1999

[51] Int. Cl.$^7$ .................................................. G11C 16/04
[52] U.S. Cl. ............................... 365/185.18; 365/185.23; 365/185.29; 365/185.33
[58] Field of Search .......................... 365/185.18, 185.23, 365/185.29, 185.33

[56] References Cited

U.S. PATENT DOCUMENTS

| | | | |
|---|---|---|---|
| 5,442,586 | 8/1995 | Javanifard et al. | 365/185 |
| 5,805,499 | 9/1998 | Haddad | 365/185.19 |
| 5,821,909 | 10/1998 | Yiu et al. | 365/185.14 |
| 6,009,022 | 12/1999 | Lee et al. | 365/189.09 |

*Primary Examiner*—Son T. Dinh
*Assistant Examiner*—Hien Nguyen
*Attorney, Agent, or Firm*—Fliesler Dubb Meyer & Lovejoy LLP

[57] ABSTRACT

A method for fast programming of non-volatile memory cells in a non-volatile memory array comprises the steps of providing an acceleration voltage greater than the internal pump voltage supplied by a conventional internal drain pump, providing a program write command, and coupling the acceleration voltage to provide a programming current to all of the bit lines selected to be programmed at a time. In an embodiment, the acceleration voltage is reduced to a drain voltage before it is applied to the drains of the memory cells. In an embodiment in which the flash memory cells comprise typical dual-gate NOR devices, the acceleration voltage is in the range of about 7 V to about 10 V, and the drain voltage is on the order of about 5 V. The sources of the memory cells are grounded during the fast programming operation. In a further embodiment, the method further comprises the steps of detecting the acceleration voltage, generating an acceleration voltage indicator signal in response to the presence of the acceleration voltage, and generating a fast program write command in response to the acceleration voltage indicator signal and the program write command to set the flash memory cells in a fast program mode.

32 Claims, 4 Drawing Sheets

| | Z3(0) | Z3(1) | Z3(2) | Z3(3) |
|---|---|---|---|---|
| Z4(17) | SS1 | SS3 | SS5 | SS7 |
| Z4(16) | SS0 | SS2 | SS4 | SS6 |
| Z4(15) | SA60 | SA61 | SA62 | SA63 |
| Z4(14) | SA56 | SA57 | SA58 | SA59 |
| Z4(13) | SA52 | SA53 | SA54 | SA55 |
| Z4(12) | SA48 | SA49 | SA50 | SA51 |
| Z4(11) | SA44 | SA45 | SA46 | SA47 |
| Z4(10) | SA40 | SA41 | SA42 | SA43 |
| Z4(9) | SA36 | SA37 | SA38 | SA39 |
| Z4(8) | SA32 | SA33 | SA34 | SA35 |
| Z4(7) | SA28 | SA29 | SA30 | SA31 |
| Z4(6) | SA24 | SA25 | SA26 | SA27 |
| Z4(5) | SA20 | SA21 | SA22 | SA23 |
| Z4(4) | SA16 | SA17 | SA18 | SA19 |
| Z4(3) | SA12 | SA13 | SA14 | SA15 |
| Z4(2) | SA8 | SA9 | SA10 | SA11 |
| Z4(1) | SA4 | SA5 | SA6 | SA7 |
| Z4(0) | SA0 | SA1 | SA2 | SA3 |

FIG. 1

FAST PROGRAM MODE FOR NON-VOLATILE MEMORY

TECHNICAL FIELD

The present invention relates to a non-volatile memory, and more particularly, to a method for fast programming of memory cells in the non-volatile memory.

BACKGROUND ART

Non-volatile memory devices have been developed by the semiconductor integrated circuit industry for various applications such as computers and digital communications. A conventional non-volatile or flash memory device includes a plurality of memory cells typically organized in a plurality of memory sectors. Within each memory sector, the memory cells are arranged in an array comprising a plurality of rows and a plurality of columns. A plurality of word lines are coupled to the respective rows of the memory cells, and a plurality of bit lines are coupled to the respective columns of the memory cells. Each of the memory cells may be a typical binary dual-gate NOR device, for example, which comprises a source, a drain and a gate. Each memory cell is capable of storing one bit. During the operation of a conventional non-volatile memory, a memory cell is programmed by supplying a pump current to the drain of the memory cell through the respective bit line to which the memory cell is connected when the non-volatile memory is in a conventional embedded program mode.

When the memory cells are in a conventional embedded program mode, it is usual that more than one bit and sometimes all of the bits need be programmed on each of the word lines For example, if a memory sector comprises a 16-bit words, then a row of sixteen memory cells are disposed on each word line, and sixteen bit lines are connected to the sixteen memory cells, respectively.

In a conventional embedded program mode, a pump current is supplied to the drain of each memory cell to be programmed. A conventional drain pump is typically capable of supplying only a limited amount of total pump current to some but not all of the bit lines simultaneously. For example, in conventional programming of flash memory cells comprising typical dual-gate NOR devices, wherein each NOR gate stores either bit "0" upon being "programmed" or bit "1" upon being "erased", a pump current typically on the order of about 0.5 mA need be provided to the drain of each memory cell to be programmed with bit "0" through the respective bit line.

However, a conventional internal drain pump with a typical voltage supply of 3 V or lower is typically limited in its capability to supplying pump currents to the drains of no more than five of the memory cells at a time. In order to program a 16-bit word, for example, the sixteen bit lines are grouped into four sets, each set comprising four bit lines. When the memory cells are programmed in a conventional embedded program mode, the conventional internal drain pump is connected to provide pump currents to program the memory cells on the respective bit lines one set at a time. For example, a typical 16-bit word with bits numbered 0–15 may be grouped into four sets of bits numbered 0–3, 4–7, 8–11 and 12–15. When any set of four bits are to be programmed with up to four zeroes, this arrangement ensures that a sufficient pump current is supplied to the drain of each of the memory cells through the respective bit line.

Because the conventional internal drain pump has a limited current supply and is typically capable of programming the memory cells on the bit lines only one set at a time, it takes a plurality of pulses generated by the internal drain pump to be supplied to different sets of bit lines during the programming of each word along each word line. Moreover, the power from the internal drain pump need be switched to different sets of bit lines during the programming of each word. Therefore, programming of a whole sector of memory cells can be time consuming in the conventional embedded program mode.

Therefore, there is a need for a method of programming the memory cells in the non-volatile memory with a programming speed faster than that which is achieved by the conventional embedded programming mode.

DISCLOSURE OF THE INVENTION

The present invention satisfies this need. In accordance with the present invention, a method for fast programming of non-volatile memory cells generally comprises the steps of:

(a) providing an acceleration voltage greater than the internal pump voltage supplied by a conventional internal voltage supply pump, which is capable of supplying a pump current sufficient for programming only one set of a limited number of bit lines at a time;

(b) providing a program write command;

(c) disabling the internal voltage supply pump from providing the pump current to the bit lines; and (d) coupling the acceleration voltage to provide a programming current to the bit lines selected to be programmed in all of the sets at a time.

In an embodiment, the method for fast programming of memory cells according to the present invention further comprises the steps of:

(e) detecting the acceleration voltage;

(f) generating an acceleration voltage indicator signal in response to a determination by the step of detecting the acceleration voltage that the acceleration voltage is present; and (g) generating a fast program write command in response to the acceleration voltage indicator signal and the program write command.

In a further embodiment, the steps of providing the program write command comprises the steps of:

(i) performing a first write cycle, comprising the steps of performing a first address writing operation and a first data writing operation; and (ii) performing a second write cycle, comprising the steps of performing a second address writing operation and a second data writing operation.

The acceleration voltage may be provided by a power source external to the non-volatile memory through an acceleration pin, for example. The present invention is applicable to fast programming of flash memory cells which comprise typical dual-gate NOR devices, for example, which are programmed by applying a drain voltage to the drains of the memory cells through the respective bit lines to be programmed. In an embodiment in which the drain voltage is less than the acceleration voltage, the step of coupling the acceleration voltage to provide the programming current to the selected bit lines comprises the steps of:

(i) reducing the acceleration voltage to a drain voltage; and (ii) applying the drain voltage to the drains of the memory cells on the selected bit lines in all of the sets at a time.

The acceleration voltage, which is greater than the internal pump voltage supplied by the internal drain pump in a conventional embedded program mode, may be in the range of about 7 V to about 10 V in an embodiment. In a further embodiment, the drain voltage, which is generated by regulating the acceleration voltage in the fast program mode according to the present invention, is on the order of about 5 V in an embodiment for typical dual-gate NOR flash memory cells. In an embodiment in which the memory cells comprise typical dual-gate NOR devices, each of the memory cells stores bit "0" upon being programmed.

In an additional embodiment, the acceleration voltage is supplied as a gate voltage to any one of the word lines selected to be programmed in the fast program mode according to the present invention. The acceleration voltage may be supplied as a gate voltage to the word lines successively one at a time, for example, to turn on each row of memory cells in the flash memory array to be programmed. The acceleration voltage, which is in the range of about 7 V to about 10 V in an embodiment, may be supplied without regulation to each of the word lines selected to be programmed.

Advantageously, the method for fast programming of non-volatile memory cells according to the present invention is capable of improving the speed of programming a non-volatile memory array over a conventional programming operation in a conventional embedded programming mode. Furthermore, the method according to the present invention is capable of improving the programming speed by programming the memory cells on all sets of the bit lines simultaneously using a single voltage source.

BRIEF DESCRIPTION OF THE DRAWINGS

The present invention will be described with respect to particular embodiments thereof, and references will be made to the drawings in which:

FIG. 1 is a simplified diagram showing a typical arrangement of memory sectors in a typical non-volatile memory device;

MODES FOR CARRYING OUT THE INVENTION

FIG. 1 shows a simplified diagram of an example of a non-volatile memory device which includes a plurality of memory sectors indicated by blocks SA0, SA1, SA2, ... SA63 and SS0, SS1, SS2, ... SS7. The memory sectors SA0, SA1, SA2, ... SA63 and SS0, SS1, SS2, ... SS7 are arranged in a plurality of rows and columns, with each row containing four memory sectors. The rows of the memory sectors are numbered consecutively from Z4 (0) to Z4 (17), and the columns of the memory sectors are numbered consecutively from Z3(0) to Z3(3). Sectors labeled SA0, SA1, SA2, ... SA63 may be used for data or code storage, whereas sectors labeled SS0, SS1, SS2, ... SS7 are reserved for code storage. Each of the sectors comprises an array of memory cells arranged in a plurality of columns and rows. A plurality of word lines are coupled to the respective rows, and a plurality of bit lines are coupled to the respective columns of the memory cells. For example, if each of the sectors labeled SA0, SA1, SA2, ... SA63 has 64 kilobytes of memory, each sector may include an array comprising 512 word lines and 1,024 bit lines.

As described in Background Art above, the individual bits within each word are grouped into a plurality of sets, for example, four sets each containing four bits in a 16-bit word. The bit lines are arranged in a plurality of corresponding sets to allow a conventional internal voltage supply or drain pump to provide the required pump currents for programming the memory cells on the bit lines one set at a time in a conventional embedded program mode, since the conventional internal voltage supply pump is typically incapable of providing the total pump current required for programming all sixteen bits of any particular word simultaneously.

Figure 2:
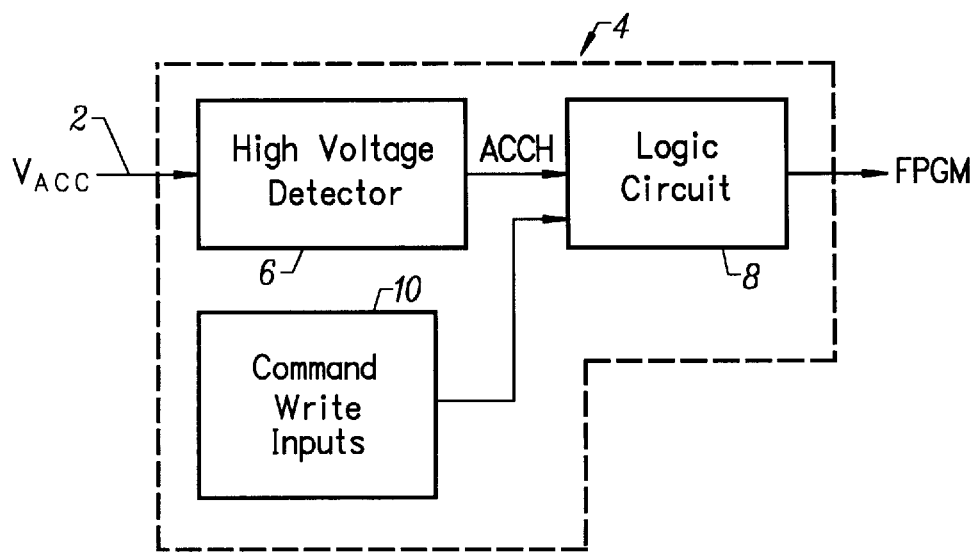
FIG. 2 shows a block diagram of an acceleration circuit capable of setting a flash memory in a fast program mode according to the present invention.

FIG. 2 shows a block diagram of an triggering circuit for fast programming of the memory cells in accordance with the present invention. The acceleration circuit generally comprises an acceleration input 2 which is capable of providing an acceleration voltage $V_{ACC}$ to supply a programming current for programming the bit lines in all the sets at a time in a fast program mode. Furthermore, the acceleration circuit comprises a triggering circuit 4, coupled to the acceleration input 2, capable of disabling the internal voltage supply pump and enabling the acceleration voltage $V_{ACC}$ to be supplied to the bit lines in all of the sets at a time in response to a presence of the acceleration voltage $V_{ACC}$ at the acceleration input 2. The acceleration voltage $V_{ACC}$ may be supplied from an acceleration pin, which serves as the acceleration input 2 and is capable of receiving the acceleration voltage $V_{ACC}$ from a source external to the integrated circuit chip for the non-volatile memory.

In the embodiment shown in FIG. 2, the triggering circuit 4 comprises a high voltage detector 6, coupled to the acceleration input 2 to receive the acceleration voltage $V_{ACC}$, which in an embodiment is in the range of about 7 V to about 10 V. The high voltage detector 6 generates an acceleration voltage indicator signal ACCH upon detecting the acceleration voltage $V_{ACC}$ at the acceleration input 2, and feeds the acceleration voltage indicator signal ACCH to a logic circuit 8.

The logic circuit 8, which has an input coupled to receive the acceleration voltage indicator signal ACCH from the high voltage detector 6, also has at least one command write input 10 to set the non-volatile memory array in a fast mode of operation. In an embodiment in which the non-volatile memory array is to be set in a fast program mode, the command write inputs 10 comprise a program command write input capable of receiving a program command. In an additional embodiment in which the non-volatile memory array is to be set in a fast chip erase mode, the command write inputs 10 further comprise an erase command write input capable of receiving an erase command.

The logic circuit 8 has an output which is capable of generating a fast program command FPGM to set the non-volatile memory array in a fast program mode in response to the presence of the acceleration voltage indicator signal ACCH generated by the high voltage detector 6 and the presence of the program command at the program command write input 10.

Figure 3:
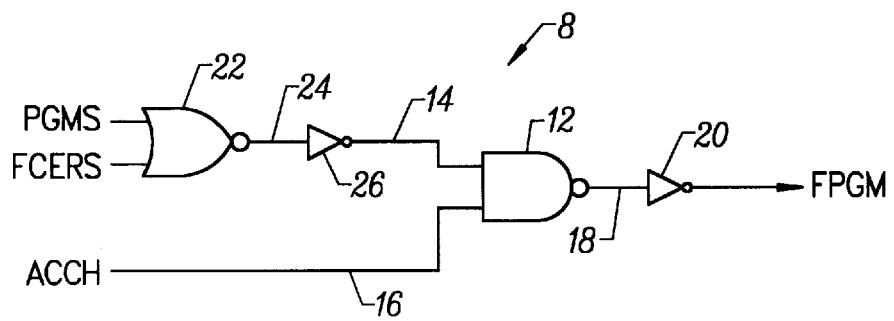
FIG. 3 shows an embodiment of a portion of the logic circuit in the block diagram of FIG. 2 for generating a fast program command FPGM.

FIG. 3 shows a logic diagram of an embodiment of a portion of the logic circuit 8 in the acceleration circuit of FIG. 2. In this embodiment, the logic circuit 8 comprises a NAND gate 12 having a first input 14 coupled to receive the program write command PGMS, a second input 16 coupled to receive the acceleration voltage indicator signal ACCH, and an output 18 coupled to an inverter 20, which in response generates the output fast program command FPGM. In this embodiment, the input program write command PGMS may be a program command for setting the non-volatile memory array in either a conventional embedded program mode or the fast program mode according to the present invention. The NAND gate 12 in the logic circuit 8 requires that both the input program write command PGMS and the acceleration voltage indicator signal ACCH be present in order to set the non-volatile memory array in a fast program mode.

In a further embodiment in which a fast chip erase mode is also desired for the non-volatile memory array, another input is provided to receive a fast chip erase command write signal FCERS. In an embodiment, a NOR gate 22 is provided in the logic circuit 8 with inputs coupled to receive the input program write command PGMS and the fast chip erase command write signal FCERS. The NOR gate 22 has an output 24 which is coupled to the input of an inverter 26, the output of which is connected to the first input 14 of the NAND gate 12. When the non-volatile memory array is set in the fast chip erase mode, a fast preprogramming operation is initiated to "program" all of the memory cells with bit "0" before they are "erased" with bit "1". The initial fast preprogramming operation in the fast chip erase mode follows the same process steps as those performed on the memory cells during the fast programming operation in the fast program mode. Therefore, the presence of the fast chip erase command write signal FCERS and the acceleration voltage indicator signal ACCH would also trigger the logic circuit 8 to generate the fast program command FPGM.

Figure 4:
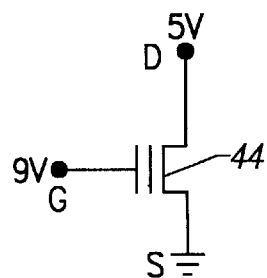
FIG. 4 shows an embodiment of voltages applied to the drain, source and gate of a memory cell comprising a typical binary dual-gate NOR device when it is programmed in the fast program mode according to the present invention.

FIG. 4 illustrates the voltages applied to the drain, source and gate of a typical flash memory cell, which in this embodiment comprises a typical NOR device. FIG. 4 shows the voltages applied to the memory cell when it is being programmed with bit "0" in the fast program mode according to the present invention. The drain D of the memory cell 44 is applied a voltage on the order of about 5 V, the gate G is applied a voltage on the order of about 9 V, and the source S of the memory cell 44 is grounded.

Figure 5:
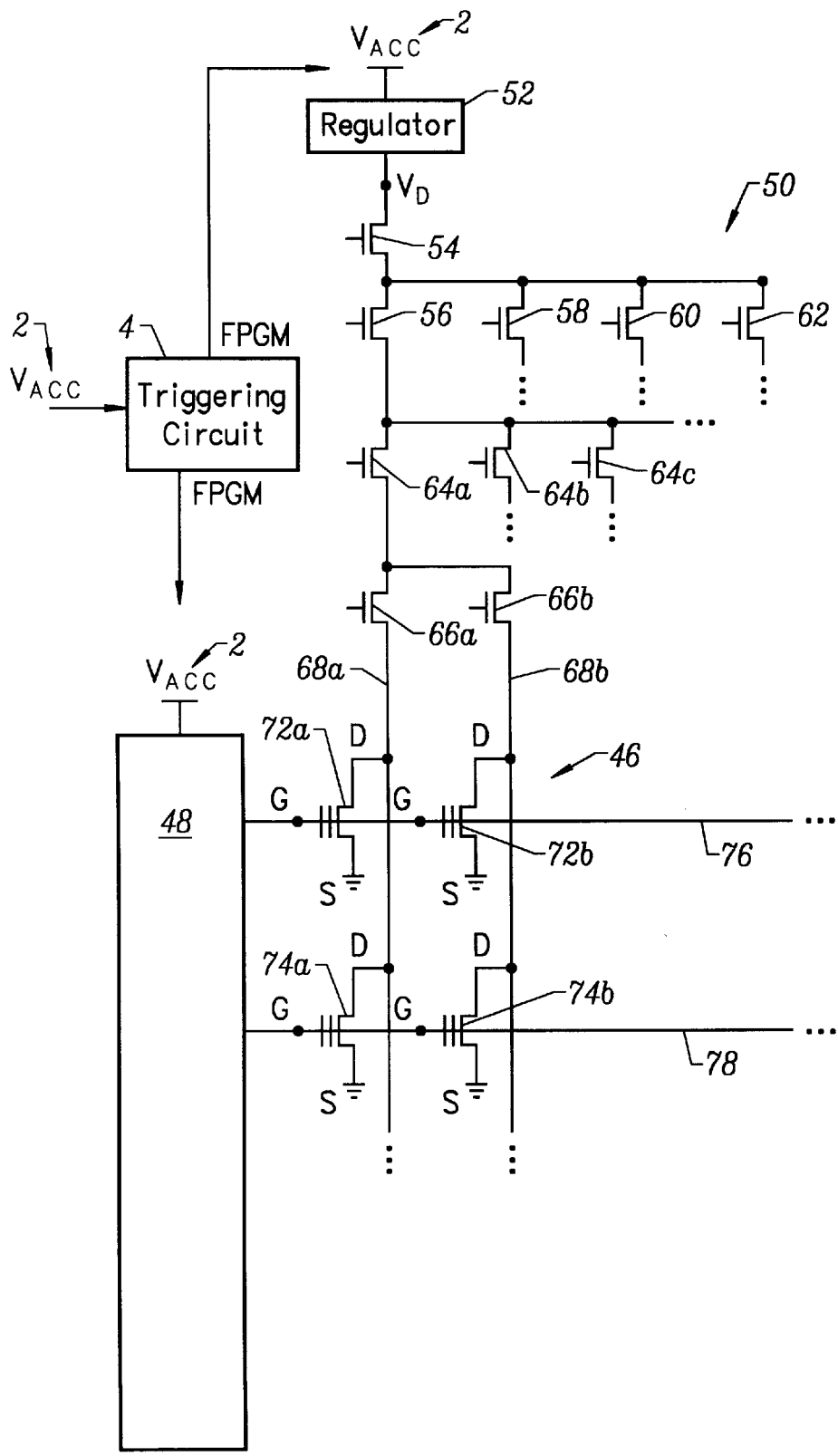
FIG. 5 is a circuit diagram showing an application of the acceleration circuit of FIG. 2 to fast programming of memory cells in the fast program mode according to the present invention.

FIG. 5 shows a circuit diagram of a memory sector including a memory array 46, a row decoder, also called an X-decoder 48, a column decoder, also called a Y-decoder 50, a triggering circuit 4, and an acceleration input 2 when the memory array 46 is in a fast program mode according to the present invention. In this embodiment, a fast program command signal FPGM generated by the triggering circuit 4 triggers the acceleration input 2 to supply power to generate the drain voltage $V_D$. In an embodiment in which the acceleration voltage $V_{ACC}$ is in the range of about 7 V to about 10 V, a regulator 52 is coupled to the acceleration input 2 to reduce the acceleration voltage $V_{ACC}$ to a desired drain voltage $V_D$, which is typically on the order of about 5 V for conventional flash memory cells comprising dual-gate NOR devices.

In the example shown in FIG. 5, a fast programming switch 54 comprises a conventional MOS transistor which is capable of supplying the drain voltage $V_D$ to the Y-decoder 50. In an embodiment, the Y-decoder 50 comprises multiple rows of conventional MOS transistors to selectively distribute the current produced by the drain voltage $V_D$ to the bit lines in the memory array. In the example illustrated in FIG. 5, the Y-decoder 50 comprises four first-level MOS transistors 56, 58, 60 and 62 coupled to the fast programming transistor 54. The current from each of the first-level transistors 56, 58, 60 and 62 is routed to a plurality of second-level MOS transistors. For example, the current flowing from the first-level transistor 56 is routed to second-level transistors 64a, 64b, 64c, . . . . Furthermore, each of the second level transistors 64a, 64b, 64c, . . . is coupled to two third-level MOS transistors, each of which is connected to a respective bit line in the memory array 46 to supply a programming current to the drain of a memory cell on the respective bit line. For example, the second-level transistor 64a is coupled to two third-level transistors 66a and 66b which distribute programming currents to bit lines 68a and 68b, respectively.

The number of rows of transistors and the number of transistors within each row in the Y-decoder 50 depends upon the number of bit lines in each sector of memory array. If the regulator 52 is coupled to supply programming currents to 64 bit lines, for example, four first-level MOS transistors are coupled to the fast programming transistor 54, eight second-level MOS transistors are coupled to each of the first-level transistors, and two third-level MOS transistors are coupled to each of the second-level transistors in the Y-decoder 50.

In the fast program mode, the MOS transistors in the Y-decoder 50 may be selectively turned on or off to selectively program the bit lines, but all of the bit lines selected to be programmed in the array 46 are supplied with a single pulse of drain voltage $V_D$ when each word is programmed in the fast program mode. The column decoding scheme as shown in FIG. 5 is merely an illustrative example of means for supplying the current produced by the acceleration voltage $V_{ACC}$ to each of the bit lines in a flash memory array. However, the present invention is not limited to the column decoding scheme as shown in FIG. 5. Other column decoding schemes can also be used to distribute the current from the acceleration input 2 to the bit lines in the memory array within the scope of the present invention.

In a further embodiment, The acceleration voltage $V_{ACC}$ may be supplied to the word lines as a gate voltage for the memory cells in the fast program mode. FIG. 5 shows a portion of the memory array 46 with four memory cells 72a, 72b, 74a and 74b each comprising a conventional dual-gate NOR device. The gates of the memory cells 72a and 72b are connected to the X-decoder 48 through word line 76, while the gates of the memory cells 74a and 74b are connected to the X-decoder 48 through word line 78. Although the gate turn-on voltage for a typical dual-gate NOR device is typically on the order of about 9 V, a voltage on the order of about 7 V to 10 V is sufficient to turn on the NOR devices on the word line selected to be programmed.

The gates of the NOR devices in each row are connected to a respective word line. The current flowing through the word line selected to be programmed is negligibly small because the word line is used only to supply a gate voltage to the memory cells in the respective row. Therefore, the power supply for the X-decoder 48 is usually not critical to the limitations of current supply by the power source.

In an embodiment, the acceleration voltage $V_{ACC}$ is supplied from the acceleration input 2 to the X-decoder 48 without regulation. When the memory array 46 is in the fast program mode, the word lines 76, 78, . . . in the memory array 46 may be turned on successively one at a time to program the memory cells on each word line. For example, when the acceleration voltage $V_{ACC}$ is supplied to the word line 76, the NOR devices 72a and 72b are turned on. When the drain voltage $V_D$, which is generated by the regulator 52 by reducing the acceleration voltage $V_{ACC}$, provides the programming current through the fast programming switch 54 and the Y-decoder 50 to the drain of the memory cell 72a, for example, memory cell 72a is programmed with bit "0".

After all of the memory cells along the word line 76 are programmed, the unregulated acceleration voltage $V_{ACC}$ is supplied to the next word line 78 by the X-decoder 48 to turn on the memory cells along the word line 78. A single pulse of drain voltage $V_D$ is then capable of programming all of the memory cells including memory cells 74a and 74b along the word line 78 with bit "0". In the fast program mode according to the present invention, the sources of the memory cells are grounded.

The present invention provides a method for fast programming of the memory cells, roughly comprising the steps of:

(a) providing an acceleration voltage $V_{ACC}$ greater than the internal pump voltage generated by a conventional internal drain pump;

(b) providing a program write command PGMS;

(c) disabling the internal drain pump from providing a pump current to the bit lines; and (d) coupling the acceleration voltage $V_{ACC}$ to provide a programming current to the bit lines selected to be programmed in all of the sets at a time.

Figure 6:
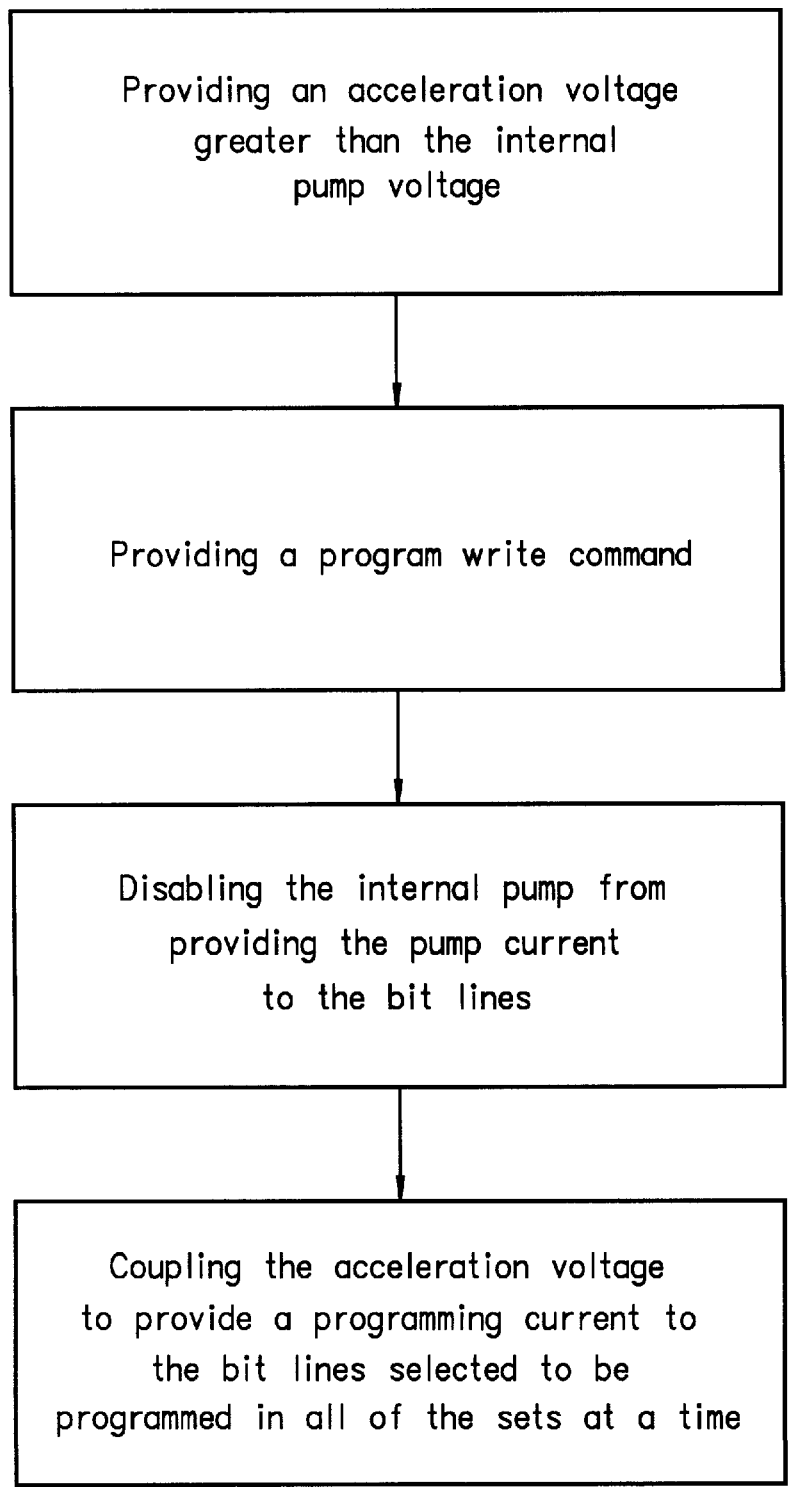
FIG. 6 is a flow chart roughly illustrating a method for fast programming of a non-volatile memory array according to the present invention.

The method for fast programming of a non-volatile memory array in a fast program mode according to the present invention is roughly illustrated in the flow chart of FIG. 6. In an embodiment, the step of coupling the acceleration voltage to provide the programming current to the bit lines comprises the steps of:

(i) reducing the acceleration voltage $V_{ACC}$ to a drain voltage $V_D$; and (ii) applying the drain voltage $V_D$ to the drains of the memory cells on the bit lines selected to be programmed in all of the sets at a time.

In a further embodiment, the method for fast programming of the memory cells further comprises the step of supplying the acceleration voltage as a gate voltage to any one of the word lines to turn on the respective row of memory cells selected to be programmed. Furthermore, the acceleration voltage may be supplied to any word line by the X-decoder 48 without regulation during fast programming of the memory cells. The sources of the memory cells are grounded during the fast programming of the memory cells.

In a further embodiment, the method for fast programming of the memory cells according to the present invention further comprises the steps of:

(e) detecting the acceleration voltage $V_{ACC}$;

(f) generating an acceleration voltage indicator signal ACCH in response to the detection of the acceleration voltage $V_{ACC}$; and (g) generating a fast program write command FPGM in response to the acceleration voltage indicator signal ACCH and the program write command PGMS.

For example, the fast program write command FPGM may be generated by a logic circuit 8 as shown in FIG. 3. The fast program write command FPGM triggers the acceleration voltage $V_{ACC}$ to be supplied to the drains of the memory cells through the respective bit lines when the input program write command PGMS and the acceleration voltage indicator signal ACCH are both present.

In a further embodiment, the step of providing the input program write command PGMS comprises the steps of:

(i) performing a first write cycle, comprising the steps of performing a first address writing operation and a first data writing operation; and (ii) performing a second write cycle, comprising the steps of performing a second address writing operation and second data writing operation.

An example of command definitions for performing the two write cycles in the step of providing the program write command PGMS is illustrated in Table A below:

TABLE A

| Command Sequences | | Bus Write Cycles Req'd | First Bus Write Cycle | | Second Bus Write Cycle | |
| --- | --- | --- | --- | --- | --- | --- |
| | | | Address | Data | Address | Data |
| Fast Program | Word | 2 | XX | AOH | PA | PD |
| | Byte | | XX | | PA | |

The list of command definitions in Table A above is only one example of initiating a fast programming operation on the memory cells, with each bus write cycle comprising an address writing operation and a data writing operation. It is noted that in this example, there is no difference in the command definitions between fast programming of a word and fast programming of a byte, because all of the bytes on any given word line can be programmed simultaneously in the fast program mode according to the present invention. Command definitions and the number of write cycles may be different for different types of flash memory devices, and may be specified differently by a person skilled in the art.

In an embodiment in which each of the memory cells in the non-volatile memory array comprises a typical dual-gate NOR device, the drain voltage is typically on the order of about 5 V, the gate voltage is in the range of about 7 V to about 10 V, and the sources of the memory cells are grounded. In an embodiment in which the acceleration voltage supplied from an external source is in the range of about 7 V to about 10 V, the step of coupling the acceleration voltage to provide the programming current comprises the steps of reducing the acceleration voltage to a programming voltage on the order of about 5 V and applying the programming voltage to the drains of the memory cells on all of the bit lines selected to be programmed. Furthermore, the acceleration voltage may be supplied to any one of the word lines selected to be programmed without regulation. For example, the X-decoder 48 as shown in FIG. 5 may be coupled to supply the acceleration voltage $V_{ACC}$ to the word lines one at a time to program the bits within each word. A single pulse of drain voltage $V_D$ is supplied simultaneously by the Y-decoder 50 to all of the memory cells to be programmed on each word line in the fast program mode. In an embodiment, each of the memory cells stores bit "0" upon being programmed.

An advantage of the method according to the present invention is that it is able to achieve a programming speed significantly faster than that which is achieved by the conventional embedded programming mode. A further advantage of the method according to the present invention is that only a single acceleration voltage source is needed to program all of the bits along any given word line simultaneously. Furthermore, the acceleration voltage $V_{ACC}$ may be supplied by a conventional power source external to the flash memory through only one acceleration pin, without significant redesign of the packaging of the device.

INDUSTRIAL APPLICABILITY

The method for fast programming of non-volatile memory cells according to the present invention is applicable to a wide variety of non-volatile memories including flash memories. Although examples of its applications in a typical flash memory array comprising conventional dual-gate NOR devices were described above, the method according to the present invention is not limited to the fast programming of dual-gate NOR devices. Furthermore, the present invention is not limited to the voltages applied to the drains, sources and gates of NOR devices in the examples described above. The principles of the present invention are applicable to different types of flash memory devices with different voltage and current requirements for fast programming operations.

The invention has been described with respect to particular embodiments thereof, and numerous modifications can be made which are within the scope of the invention as set forth in the claims.

What is claimed is:

1. In a non-volatile memory comprising at least one array of memory cells arranged in a plurality of rows and a plurality of columns, a plurality of word lines coupled to the respective rows of the memory cells, a plurality of bit lines coupled to the respective columns of the memory cells, each of the memory cells comprising a source and a drain and capable of storing a respective bit, the bit lines arranged in a plurality of sets, a method for fast programming of the memory cells comprising the steps of:
   (a) providing an acceleration voltage;
   (b) providing a program write command;
   (c) reducing the acceleration voltage to a drain voltage; and
   (d) applying the drain voltage to the drains of the memory cells on the bit lines selected to be programmed in all of the sets simultaneously.

2. The method of claim 1, wherein the acceleration voltage is in the range of about 7 V to about 10 V.

3. The method of claim 1, wherein the acceleration voltage is in the range of about 7V to about 10V, and wherein the drain voltage is on the order of about 5 V.

4. The method of claim 1, further comprising the step of grounding the sources of the memory cells.

5. The method of claim 1, further comprising the step of supplying the acceleration voltage as a gate voltage to a selected one of the word lines to be programmed.

6. The method of claim 5, wherein the acceleration voltage is supplied to the selected word line unregulated.

7. The method of claim 1, further comprising the steps of:
   (d) detecting the acceleration voltage;
   (e) generating an acceleration voltage indicator signal in response to a determination by the step of detecting the acceleration voltage that the acceleration voltage is present; and
   (f) generating a fast program write command in response to the acceleration voltage indicator signal and the program write command.

8. The method of claim 1, wherein the step of providing the program write command comprises the steps of:
   (i) performing a first write cycle, comprising the steps of performing a first address writing operation and a first data writing operation; and
   (ii) performing a second write cycle, comprising the steps of performing a second address writing operation and a second data writing operation.

9. The method of claim 1, wherein each of the memory cells stores bit "0" upon being programmed.

10. In a non-volatile memory comprising at least one array of memory cells arranged in a plurality of rows and a plurality of columns, a plurality of word lines coupled to the respective rows of the memory cells, a plurality of bit lines coupled to the respective columns of the memory cells, each of the memory cells comprising a source and a drain and capable of storing a respective bit, the bit lines arranged in a plurality of sets, a method for fast programming of the memory cells comprising the steps of:
   (a) providing an acceleration voltage;
   (b) providing a program write command;
   (c) detecting the acceleration voltage;
   (d) generating an acceleration voltage indicator signal in response to a determination by the step of detecting the acceleration voltage that the acceleration voltage is present;
   (e) generating a fast program write command in response to the acceleration voltage indicator signal and the program write command;
   (f) reducing the acceleration voltage to a drain voltage; and
   (g) applying the drain voltage to the drains of the memory cells on the bit lines selected to be programmed in all of the sets simultaneously.

11. The method of claim 10, wherein the acceleration voltage is in the range of about 7 V to about 10 V.

12. The method of claim 10, wherein the acceleration voltage is in the range of about 7 V to about 10 V, and wherein the drain voltage is on the order of about 5 V.

13. The method of claim 10, further comprising the step of grounding the sources of the memory cells.

14. The method of claim 10, further comprising the step of supplying the acceleration voltage as a gate voltage to a selected one of the word lines to be programmed.

15. The method of claim 14, wherein the acceleration voltage is supplied to the selected word line unregulated.

16. The method of claim 10, wherein the step of providing the program write command comprises the steps of:
   (i) performing a first write cycle, comprising the steps of performing a first address writing operation and a first data writing operation; and
   (ii) performing a second write cycle, comprising the steps of performing a second address writing operation and a second data writing operation.

17. The method of claim 10, wherein each of the memory cells stores bit "0" upon being programmed.

18. In a non-volatile memory comprising at least one array of memory cells arranged in a plurality of rows and a plurality of columns, a plurality of word lines coupled to the respective rows of the memory cells, a plurality of bit lines coupled to the respective columns of the memory cells, each of the memory cells comprising a source and a drain and capable of storing a respective bit, the bit lines arranged in a plurality of sets, a method for fast programming of the memory cells comprising the steps of:
   (a) providing an acceleration voltage;
   (b) providing a program write command;
   (c) reducing the acceleration voltage to a drain voltage; and
   (d) applying the drain voltage to the drains of the memory cells on the bit lines selected to be programmed in all of the sets simultaneously.

19. The method of claim 18, further comprising the step of grounding the sources of the memory cells.

20. The method of claim 18, wherein the acceleration voltage is in the range of about 7 V to about 10 V, and wherein the drain voltage is on the order of about 5 V.

21. The method of claim 18, further comprising the step of supplying the acceleration voltage as a gate voltage to a selected one of the word lines to be programmed.

22. The method of claim 21, wherein the acceleration voltage is supplied to the selected word line unregulated.

23. The method of claim 18, further comprising the steps of:
   (f) detecting the acceleration voltage;
   (g) generating an acceleration voltage indicator signal in response to a determination by the step of detecting the acceleration voltage that the acceleration voltage is present; and
   (h) generating a fast program write command in response to the acceleration voltage indicator signal and the program write command.

24. The method of claim 18, wherein the step of providing the program write command comprises the steps of:
   (i) performing a first write cycle, comprising the steps of performing a first address writing operation and a first data writing operation; and
   (ii) performing a second write cycle, comprising the steps of performing a second address writing operation and a second data writing operation.

25. The method of claim 18, wherein each of the memory cells stores bit "0" upon being programmed.

26. In a non-volatile memory comprising at least one array of memory cells arranged in a plurality of rows and a plurality of columns, a plurality of word lines coupled to the respective rows of the memory cells, a plurality of bit lines coupled to the respective columns of the memory cells, each of the memory cells comprising a source and a drain and capable of storing a respective bit, the bit lines arranged in a plurality of sets, a method for fast programming of the memory cells comprising the steps of:
   (a) providing an acceleration voltage greater than the internal pump voltage;
   (b) providing a program write command;
   (c) detecting the acceleration voltage;
   (d) generating an acceleration voltage indicator signal in response to a determination by the step of detecting the acceleration voltage that the acceleration voltage is present;
   (e) generating a fast program write command in response to the acceleration voltage indicator signal and the program write command;
   (f) reducing the acceleration voltage to a drain voltage; and
   (g) applying the drain voltage to the drains of the memory cells on the bit lines selected to be programmed in all of the sets simultaneously.

27. The method of claim 26, further comprising the step of grounding the sources of the memory cells.

28. The method of claim 26, wherein the acceleration voltage is in the range of about 7 V to about 10 V, and wherein the drain voltage is on the order of about 5 V.

29. The method of claim 26, further comprising the step of supplying the acceleration voltage as a gate voltage to a selected one of the word lines to be programmed.

30. The method of claim 29, wherein the acceleration voltage is supplied to the selected word line unregulated.

31. The method of claim 26, wherein the step of providing the program write command comprises the steps of:
   (i) performing a first write cycle, comprising the steps of performing a first address writing operation and a first data writing operation; and
   (ii) performing a second write cycle, comprising the steps of performing a second address writing operation and a second data writing operation.

32. The method of claim 26, wherein each of the memory cells stores bit "0" upon being programmed.

* * * * *